US012628390B2

(12) United States Patent
Li et al.

(10) Patent No.: US 12,628,390 B2
(45) Date of Patent: May 12, 2026

(54) NANOSHEET STACKS WITH DIELECTRIC ISOLATION LAYERS

(71) Applicant: International Business Machines Corporation, Armonk, NY (US)

(72) Inventors: Juntao Li, Cohoes, NY (US); Ruilong Xie, Niskayuna, NY (US); Julien Frougier, Albany, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 17/948,877

(22) Filed: Sep. 20, 2022

(65) Prior Publication Data

US 2024/0096952 A1 Mar. 21, 2024

(51) Int. Cl.
*H10D 62/10* (2025.01)
*H10D 30/67* (2025.01)

(52) U.S. Cl.
CPC ....... *H10D 62/121* (2025.01); *H10D 30/6757* (2025.01); *H10D 62/115* (2025.01)

(58) Field of Classification Search
None
See application file for complete search history.

(56) References Cited

U.S. PATENT DOCUMENTS

| | | | |
|---|---|---|---|
| 9,960,077 B1 | 5/2018 | Zang et al. | |
| 10,332,809 B1 * | 6/2019 | Ando | ................. H10D 30/6735 |
| 10,388,510 B2 | 8/2019 | De Silva et al. | |
| 10,510,620 B1 * | 12/2019 | Chanemougame | .. H10D 62/121 |
| 2016/0233298 A1 | 8/2016 | Webb et al. | |
| 2018/0108770 A1 | 4/2018 | Cheng et al. | |
| 2018/0374761 A1 | 12/2018 | Guillorn et al. | |
| 2020/0357703 A1 * | 11/2020 | Lee | ...................... H10D 62/115 |
| 2020/0365584 A1 * | 11/2020 | Ando | ...................... H10D 62/83 |
| 2020/0381531 A1 | 12/2020 | Chung et al. | |
| 2020/0381545 A1 | 12/2020 | Chiang et al. | |
| 2021/0057525 A1 | 2/2021 | Chiang et al. | |
| 2021/0210489 A1 | 7/2021 | Zhang et al. | |
| 2022/0173097 A1 * | 6/2022 | Yang | ................... H10D 62/121 |

(Continued)

FOREIGN PATENT DOCUMENTS

WO 2021081155 A1 4/2021

OTHER PUBLICATIONS

J. Zhang et al., "High-k Metal Gate Fundamental Learning and Multi-VT Options for Stacked Nanosheet Gate-All-Around Transistor," 2017 IEEE International Electron Devices Meeting, Dec. 2017, 4 pages.

(Continued)

*Primary Examiner* — Nduka E Ojeh
(74) *Attorney, Agent, or Firm* — L. Jeffrey Kelly; Ryan, Mason & Lewis, LLP

(57) ABSTRACT

A semiconductor structure comprises a first nanosheet stack comprising one or more first nanosheet channel layers and a first dielectric isolation layer over the one or more first nanosheet channel layers, a second nanosheet stack comprising one or more second nanosheet channel layers and a second dielectric isolation layer over the one or more second nanosheet channel layers, and a gate dielectric layer disposed over a top surface of one of the first dielectric isolation layer and the second dielectric isolation layer.

20 Claims, 14 Drawing Sheets

(56) References Cited

U.S. PATENT DOCUMENTS

| | | | |
|---|---|---|---|
| 2022/0399336 A1* | 12/2022 | Guler ..................... | H10D 84/85 |
| 2023/0197781 A1* | 6/2023 | Cheng ................. | H10D 62/121 |
| | | | 438/157 |

OTHER PUBLICATIONS

A. Agrawal et al., "Gate-All-Around Strained Si 0.4 Ge 0.6 Nanosheet PMOS on Strain Relaxed Buffer for High Performance Low Power Logic Application," 2020 IEEE International Electron Devices Meeting, Dec. 12, 2020, 4 pages.

* cited by examiner

INTEGRATED CIRCUIT
1400

NANOSHEET TRANSISTOR
STRUCTURES WITH VARYING TOP
DIELECTRIC LAYERS
1410

NANOSHEET STACKS WITH DIELECTRIC ISOLATION LAYERS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming semiconductor structures with dielectric isolation layers on top of stacks of nanosheet channel layers of nanosheet stacks.

In one embodiment, a semiconductor structure comprises a first nanosheet stack comprising one or more first nanosheet channel layers and a first dielectric isolation layer over the one or more first nanosheet channel layers, a second nanosheet stack comprising one or more second nanosheet channel layers and a second dielectric isolation layer over the one or more second nanosheet channel layers, and a gate dielectric layer disposed over a top surface of one of the first dielectric isolation layer and the second dielectric isolation layer.

In another embodiment, a semiconductor structure comprises a first nanosheet stack, a second nanosheet stack, a shallow trench isolation region disposed over a substrate between the first nanosheet stack and the second nanosheet stack, and a gate dielectric layer (i) disposed over a first portion of the shallow trench isolation region between the first nanosheet stack and the second nanosheet stack and (ii) not disposed over a second portion of the shallow trench isolation region between the first nanosheet stack and the second nanosheet stack.

In another embodiment, an integrated circuit comprises a nanosheet transistor structure comprising a first nanosheet stack comprising one or more first nanosheet channel layers and a first dielectric isolation layer over the one or more first nanosheet channel layers, a second nanosheet stack comprising one or more second nanosheet channel layers and a second dielectric isolation layer over the one or more second nanosheet channel layers, and a gate dielectric layer disposed over a top surface of one of the first dielectric isolation layer and the second dielectric isolation layer.

These and other features and advantages of embodiments described herein will become more apparent from the accompanying drawings and the following detailed description.

DETAILED DESCRIPTION

Figures 1A, 1B:
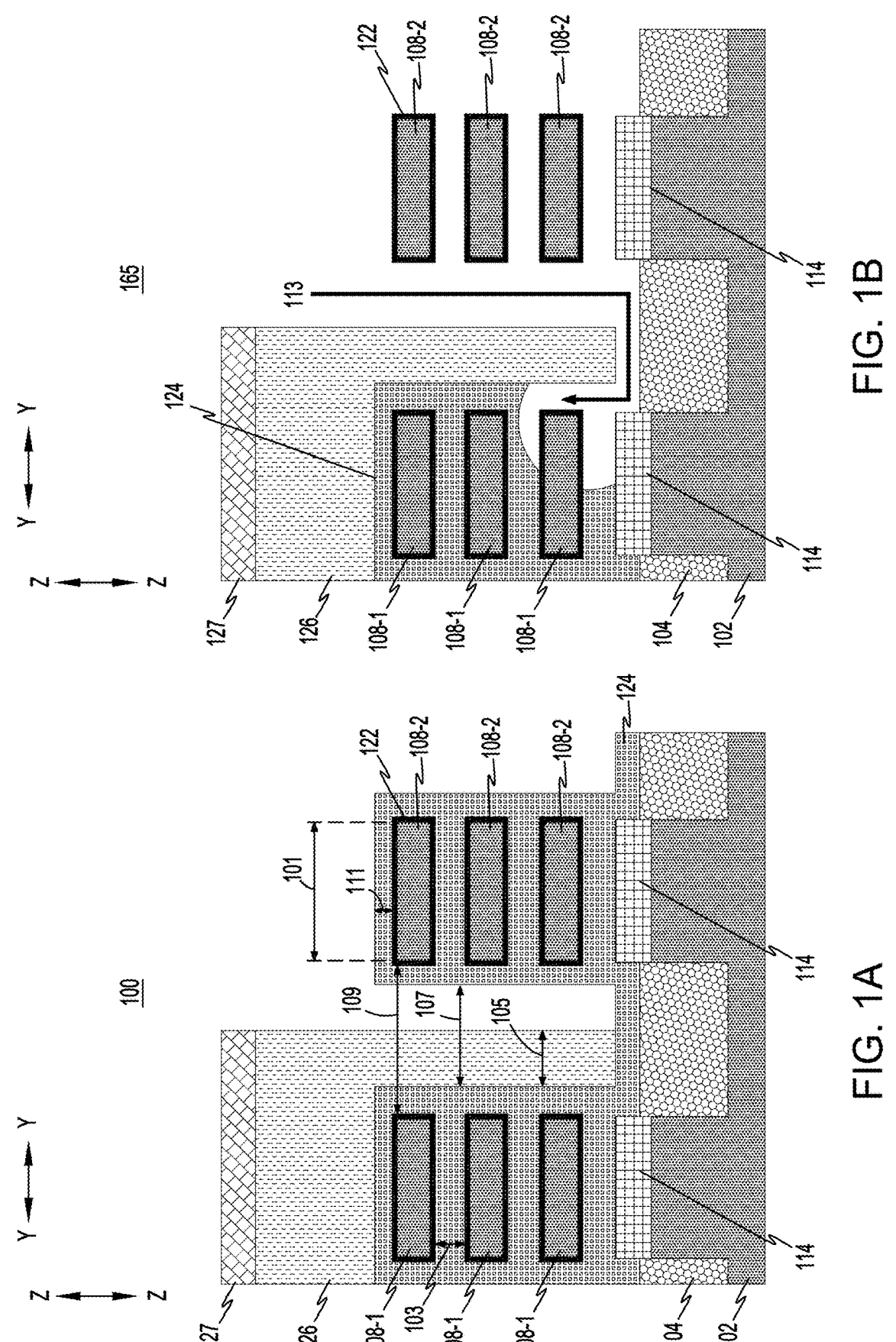
FIG. 1A depicts a side cross-sectional view of a structure following patterning of an organic planarization layer over portions of a gate conductor layer surrounding a first one of two nanosheet stacks, according to an embodiment of the invention.
FIG. 1B depicts a side cross-sectional view of the structure of FIG. 1B following etching of portions of the gate conductor layer surrounding a second one of the two nanosheet stacks, the etching including an over-etch of portions of the gate conductor layer under the organic planarization layer patterned over the first one of the two nanosheet stacks, according to an embodiment of the invention.

Illustrative embodiments of the invention may be described herein in the context of illustrative methods for forming semiconductor structures with dielectric isolation layers on top of stacks of nanosheet channel layers of nanosheet stacks, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

For nanosheet transistor CMOS structures that include combinations of nFET and pFET structures, processing is required to pattern different gate conductors for the nFET and pFET structures. Due to the tight spacing between nanosheets in a nanosheet stack, there are various challenges in patterning the different gate conductors. Such challenges are illustrated in FIGS. 1A and 1B, which show respective side cross-sectional views 100 and 165 of nanosheet transistor structures during patterning of gate conductors for nFET and pFET structures.

The side cross-sectional view 100 of FIG. 1A shows a substrate 102, shallow trench isolation regions 104, nanosheet channels 108-1 and 108-2 for pFET and nFET structures, respectively, isolation layer 114, gate dielectric layer 122, gate conductor layer 124 (e.g., a pFET work function metal (WFM) for the pFET structures), organic planarization layer (OPL) 126, and mask layer 127. As shown in FIG. 1A, the gate conductor layer 124 is formed surrounding the nanosheet channels 108-1 and 108-2 for both the pFET and nFET structures. The OPL 126 is patterned over portions of the gate conductor layer 124 which surround the pFET nanosheet channels 108-1 using mask layer 127 (e.g., which may comprise titanium oxide (TiOx) or another suitable material).

The OPL 126 is meant to protect portions of the gate conductor layer 124 which surround the pFET nanosheet channels 108-1 while portions of the gate conductor layer 124 which surround the nFET nanosheet channels 108-2 are removed. Due to the tight spacing between the nanosheet channels 108-1 and 108-2, a longer etch process (e.g., a wet clean) is needed to fully remove the portions of the gate conductor layer 124 which surround the nFET nanosheet channels 108-2. Such tight spacing is represented by the dimensions 101, 103, 105, 107, 109 and 111 shown in FIG. 1A.

Dimension 101 shows the width (in direction X) of the nanosheet channels 108-1 and 108-2, which may be 45 nm. Dimension 103 shows the vertical spacing (in direction Z) between adjacent ones of the nanosheet channels 108-1 and 108-2, which may be 11 nm. Dimension 105 shows the distance (in direction X) from the edge of the gate conductor layer 124 and the edge of the OPL 126, which may be 9 nm. Dimension 107 shows the distance (in direction X) between portions of the gate conductor layer 124 which surround the pFET nanosheet channels 108-1 and the nFET nanosheet channels 108-2, and dimension 109 shows the distance (in direction X) between the pFET nanosheet channels 108-1 and the nFET nanosheet channels 108-2. Dimension 107 may be 18 nm, and dimension 109 may be 32 nm. Dimension 111 shows the distance (in direction Z) from a top surface of the uppermost one of the nFET nanosheet channels 108-3 and a top surface of the gate conductor layer 124.

The etch of the portions of the gate conductor layer 124 surrounding the nFET nanosheet channels 108-2, as illustrated in FIG. 1B, results in a risk of over-etching under the OPL 126. The wet clean budget required to clean the gate conductor layer 124 in between the nFET nanosheet channels 108-2 (e.g., 45 nm/2=22.5 nm versus the OPL 126 lateral extension of 9 nm in dimension 105) results in an inevitable over-etch under the OPL 126 as shown in region 113. Such issues are exacerbated when the N-to-P spacing (e.g., dimension 109) is reduced, and as the width of the devices (e.g., dimension 101) increases.

One approach for avoiding over-etch under the OPL 126 is to form a dielectric bar or liner between the pFET nanosheet channels 108-1 and the nFET nanosheet channels 108-2. Such an approach, however, introduces significant process complexity. Further, the dielectric bar or liner may need to be thick to ensure that reactive-ion etching (ME) can be performed for dummy gate processing. Another approach for avoiding over-etch under the OPL 126 is to perform reflow of the OPL 126 after ME of the gate conductor layer 124 surrounding the nFET nanosheet channels 108-2. In such an approach, however, it is difficult to control the N-to-P boundary. OPL reflow with tight nanosheet spacing is restricted by OPL viscosity. Without the OPL reflow, the N-to-P boundary is not at an ideal location. For example, the N-to-P boundary may be on top of the pFET structures (e.g., the pFET nanosheet channels 108-1) because of wet etch undercut as illustrated in FIG. 1B. With OPL reflow, the N-to-P boundary may not be on top of the pFET structures, but it is much closer to the pFET structures than the nFET structures (e.g., much closer to the pFET nanosheet channels 108-1 than the nFET nanosheet channels 108-2). This is not desirable, as the N-to-P boundary should be centered between the pFET and nFET structures.

Illustrative embodiments provide approaches for nanosheet WFM or other gate conductor patterning which utilizes a reversible crosslinking OPL reflow with a novel STI structure. For example, a process flow may include forming a dielectric bar or isolation layer which protects a gate stack for top-most nanosheet channel layers in nanosheet channel stacks, followed by formation of a first WFM (or other gate conductor) surrounding both pFET and nFET nanosheet stacks. An OPL is then patterned to cover one type of structure (e.g., pFET or nFET), and a directional etch is used to remove exposed portions of the first WFM (or other gate conductor) and a gate dielectric layer (e.g., a high-k gate dielectric) formed over STI regions. A directional etch is then used to recess the exposed portions of the STI regions. This results in a stepped vertical height profile in the STI regions. An OPL reflow is then performed, which extends down the stepped vertical height profile in the STI regions thus protecting portions of the gate conductor layer surrounding the pFET nanosheet stack. Remaining portions of the exposed first WFM surrounding the nFET nanosheet stack are then removed. The resulting structure includes the dielectric bar or isolation layer over the top-most nanosheet channel layer for both the pFET and nFET nanosheet stacks. The gate dielectric layer is present on top of the dielectric bar or isolation layer for one type of FET (e.g., pFET) but is not present on top of the dielectric bar or isolation layer for the other type of FET (e.g., nFET). Further, the gate dielectric layer is present over the STI regions near one type of FET (e.g., pFET) but is not present over the STI regions near the other type of FET (e.g., nFET) where the STI regions are recessed.

FIGS. 2A-13B show a process flow for forming semiconductor structures with dielectric isolation layers on top of stacks of nanosheet channel layers of nanosheet stacks.

Figures 2A, 2B, 2C:
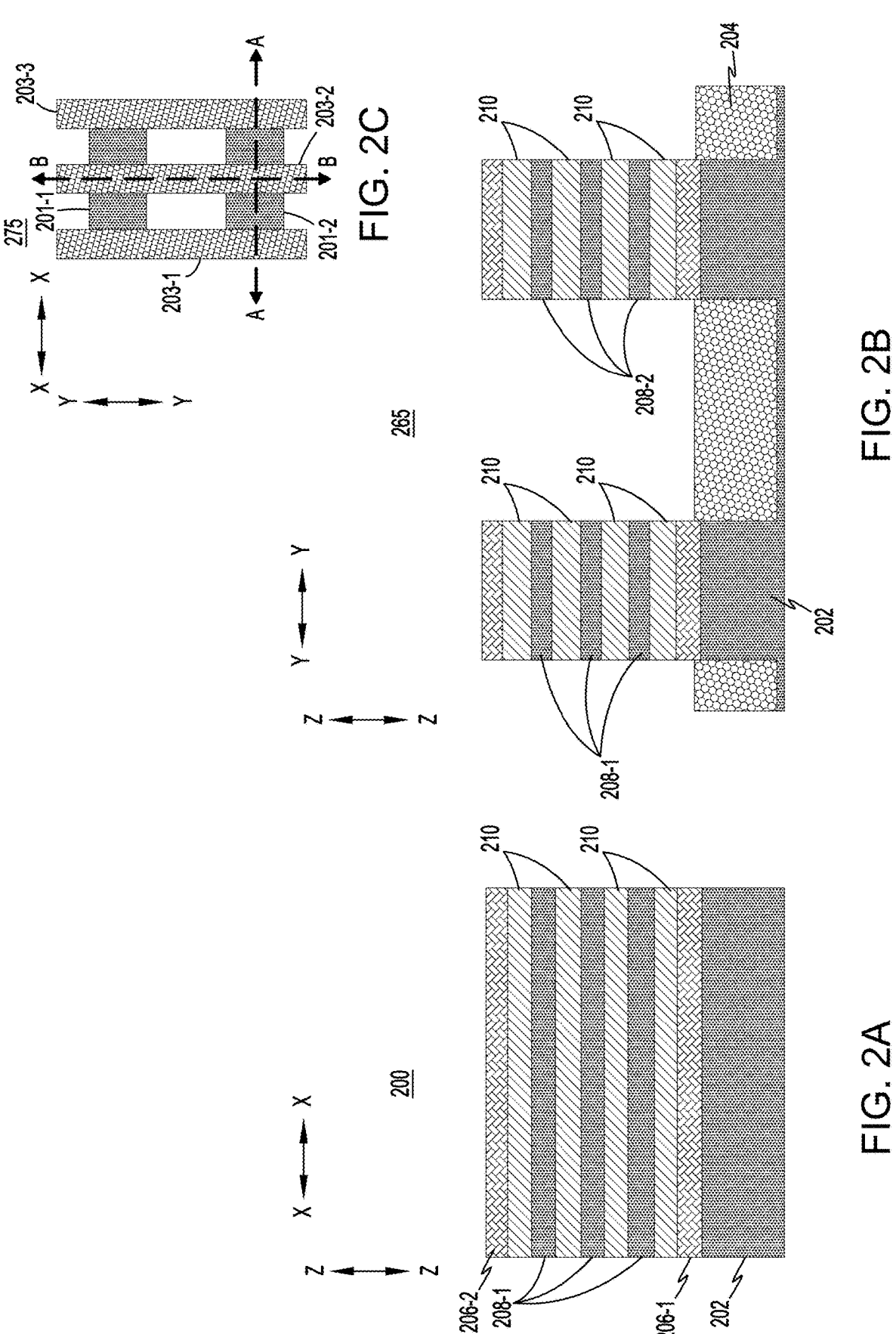
FIG. 2A shows a first side cross-sectional view of a structure following formation of a nanosheet stack and shallow trench isolation regions over a substrate, according to an embodiment of the invention.
FIG. 2B shows a second side cross-sectional view of the structure following formation of the nanosheet stack and the shallow trench isolation regions over the substrate, according to an embodiment of the invention.
FIG. 2C shows a top-down view of a structure showing nanosheet stacks and gate regions illustrating where the first and second side cross-sectional views of FIGS. 2A and 2B are taken, according to an embodiment of the invention.

FIG. 2A shows a first side cross-sectional view 200 of a structure following formation and patterning of a nanosheet stack over a substrate 202, and following formation of STI regions 204. FIG. 2B shows a second side cross-sectional view 265 of the structure, and FIG. 2C shows a top-down view 275 illustrating where the side cross-sectional views 200 and 265 of FIGS. 2A and 2B are taken. The top-down view 275 shows patterned nanosheet stacks 201-1 and 201-2 and gate regions 203-1, 203-2 and 203-3. The first side cross-sectional view 200 of FIG. 2A (as well as similarly-lettered "A" views in FIGS. 3A through 13A) are taken along the line A-A in the top-down view 275 of FIG. 2C (e.g., across the gate regions 203-1, 203-2 and 203-2 along patterned nanosheet stack 201-2). The second side cross-sectional view 265 of FIG. 2B (as well as similarly-lettered "B" views in FIGS. 3B through 13B) are taken along the line B-B in the top-down view 275 of FIG. 2C (e.g., across the patterned nanosheet stacks 201-1 and 201-2 along the gate region 203-2).

The substrate 202 may be formed of any suitable semiconductor structure, including various silicon-containing materials including but not limited to Si, SiGe, silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

A nanosheet stack is formed over the substrate 202, where the nanosheets include a sacrificial layer 206-1, nanosheet channel layers 208-1 and 208-2 (collectively, nanosheet channel layers 208), sacrificial layers 210, and sacrificial layer 206-2.

The sacrificial layers 206-1 and 206-2 (collectively, sacrificial layers 206) are illustratively formed of a first sacrificial material and the sacrificial layers 210 are illustratively formed of a second sacrificial material different than the first sacrificial material, such that the sacrificial layers 206 may be etched or otherwise removed selected to the sacrificial layers 210. In some embodiments, both the sacrificial layers 206 and sacrificial layers 210 are formed of SiGe, but with different percentages of Ge. For example, the sacrificial layers 206 may have a relatively higher percentage of Ge (e.g., 65% Ge), and the sacrificial layers 210 may have a relatively lower percentage of Ge (e.g., 30% Ge). Other combinations of different sacrificial materials may be used in other embodiments. The sacrificial layers 206 and 210 may each have a thickness (in direction Z-Z') in the range of 6-15 nm.

The nanosheet channel layers 208 may be formed of Si or another suitable material (e.g., a material similar to that used for the substrate 202). Each of the nanosheet channel layers 208 may have a thickness (in direction Z) in the range of 4-10 nm.

The STI regions 204 may be formed by patterning a masking layer over the structure, followed by etching exposed portions of the sacrificial layers 206 and 210, the nanosheet channel layers 208, and through a portion of the substrate 202. The STI regions 204 may be formed of a dielectric material such as silicon dioxide ($SiO_2$), silicon oxycarbide (SiOC), silicon oxynitride (SiON), etc. The STI regions 204 may have a height (in direction Z) in the range of 20 to 100 nm.

Figures 3A, 3B:
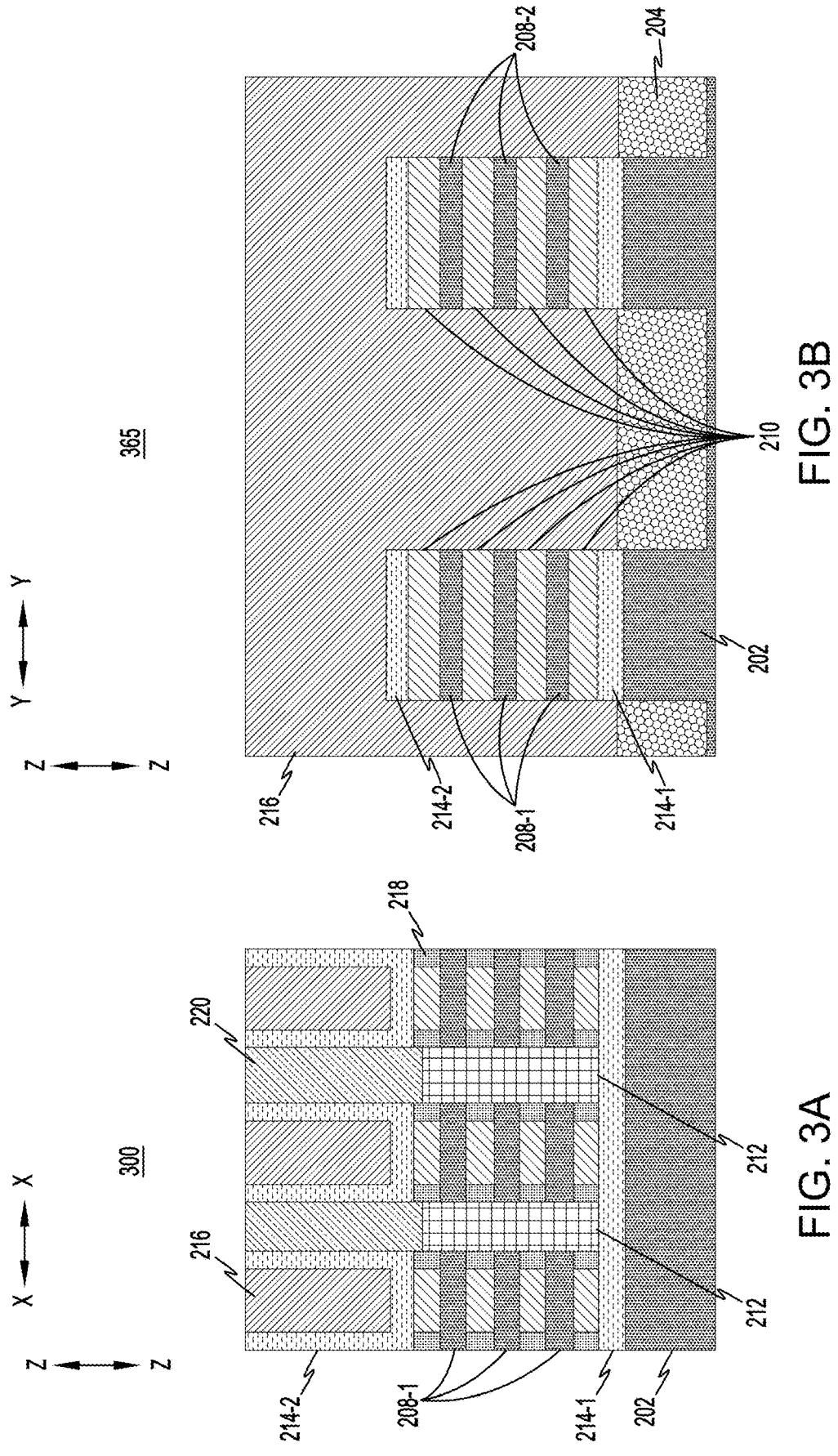
FIG. 3A shows a side cross-sectional view of the structure of FIG. 2A following gate patterning and formation of dielectric isolation layers, inner spacers, source/drain regions, and an interlayer dielectric layer, according to an embodiment of the invention.
FIG. 3B shows a side cross-sectional view of the structure of FIG. 2B following the gate patterning and the formation of the dielectric isolation layers, the inner spacers, the source/drain regions, and the interlayer dielectric layer, according to an embodiment of the invention.

FIGS. 3A and 3B show respective side cross-sectional views 300 and 365 of the structures of FIGS. 2A and 2B following gate patterning and formation of source/drain regions 212, dielectric isolation layers 214-1 and 214-2 (collectively, dielectric isolation layers 214), dummy gates 216, inner spacers 218 and interlayer dielectric (ILD) layer 220.

Material of the dummy gates 216 (e.g., amorphous silicon (a-Si) or amorphous silicon germanium (a-SiGe) over a thin $SiO_2$ or titanium nitride (TiN) layer, or another suitable material) may be blanket deposited over the structure, followed by formation and patterning of a gate hard mask layer (e.g., formed of silicon nitride (SiN), a multi-layer of SiN and $SiO_2$, or another suitable material), followed by lithographic processing to result in the patterned dummy gates 116 as shown in FIGS. 3A and 3B. The dummy gates 116 may have a height (in direction Z) in the range of 30 to 100 nm and a width (in direction X) in the range of 12 to 100 nm.

The dielectric isolation layers 214 may be formed by using a selective etch process that removes the material of the sacrificial layers 206 selective to the material of the sacrificial layers 210, followed by deposition of a dielectric material. The dielectric isolation layer 214-1 provides a bottom dielectric insulator (BDI), and the dielectric isolation layers 214-2 provide dielectric "bars" which protect the uppermost ones of the nanosheet channel layers 208 during further processing described below. The dielectric isolation layers 214 may be formed of a spacer material (e.g., any suitable insulator, such as SiN, silicon boron carbide nitride (SiBCN), silicon oxycarbonitride (SiOCN), etc.). The spacer material may be blanket deposited, filling the regions exposed by removal of the sacrificial layers 206 and over-filling the structure. The portions of the spacer material filling the region exposed by removal of the sacrificial layer 206-1 provides the BDI layer 214-1. The portions of the spacer material that overfill the structure may be etched (e.g., using reactive-ion etching (RIE) or other suitable etch processing) to result in the dielectric isolation layers 214-2 (e.g., providing sidewall spacers on sidewalls of the dummy gates 116, as well as the dielectric bar that protects the uppermost ones of the nanosheet channel layers 208.

The sacrificial layers 210 may be recessed or indented, followed by formation of the inner spacers 218 in the indent regions formed by the recess of the sacrificial layers 210. Next, portions of the nanosheet stacks which are not covered by the dummy gates 116 and the dielectric isolation layers 214-2 are etched through to the BDI layer 214-1. The source/drain regions 212 are then formed. The ILD layer 220 is filled over the source/drain regions 212 between the sidewall spacers on the dummy gates 216.

The inner spacers 218 may be formed to fill indent spaces (e.g., resulting from indent etches of the sacrificial layers 210). The inner spacers 218 may be formed of SiN or another suitable material such as SiBCN, SiCO, SiOCN, etc. The inner spacers 218 may have widths (in direction X) in the range of 5 to 15 nm, and may have heights (in direction Z) matching that of the sacrificial layers 210.

The source/drain regions 212 may be formed using epitaxial growth processes, and thus may also be referred to as epitaxial layers 212. The source/drain regions 212 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The source/drain regions 212 may be formed using epitaxial growth processes. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RT-CVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$. The source/drain regions 212 may have a width (in direction X) in the range of 10 to 30 nm.

The ILD layer 220 is formed over the top of the source/drain regions 212 between the sidewall spacers on the dummy gates 216. The ILD layer 220 may be formed of any suitable isolating material, such as $SiO_2$, SiOC, SiON, etc. The ILD layer 220 has a width (in direction X) which matches that of the source/drain regions 212. The ILD layer 220 may be planarized (e.g., using chemical mechanical planarization (CMP) or other suitable processing) such that its top surface is level with the top surface of the dielectric isolation layers 214-2 as shown in FIG. 3A.

Figures 4A, 4B:
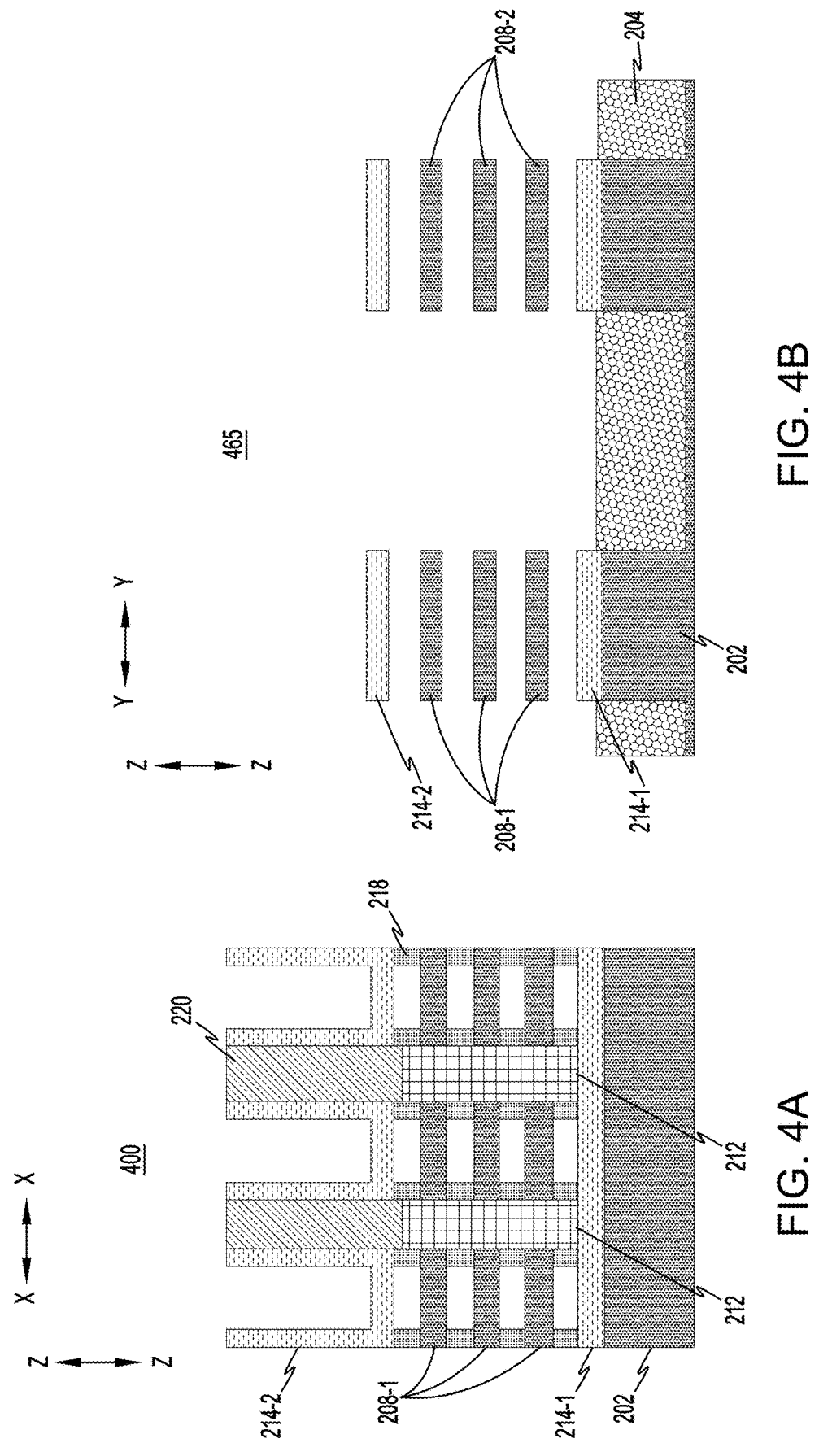
FIG. 4A shows a side cross-sectional view of the structure of FIG. 3A following dummy gate removal and removal of sacrificial layers in the nanosheet stacks, according to an embodiment of the invention.
FIG. 4B shows a side cross-sectional view of the structure of FIG. 3B following the dummy gate removal and the removal of sacrificial layers in the nanosheet stacks, according to an embodiment of the invention.

FIGS. 4A and 4B show respective side cross-sectional views 400 and 465 of the structures of FIGS. 3A and 3B following removal of the dummy gates 216 and the sacrificial layers 210. The dummy gates 216 may be removed first, followed by removal of the sacrificial layers 210 (e.g., using SiGe release or other suitable processing).

Figures 5A, 5B:
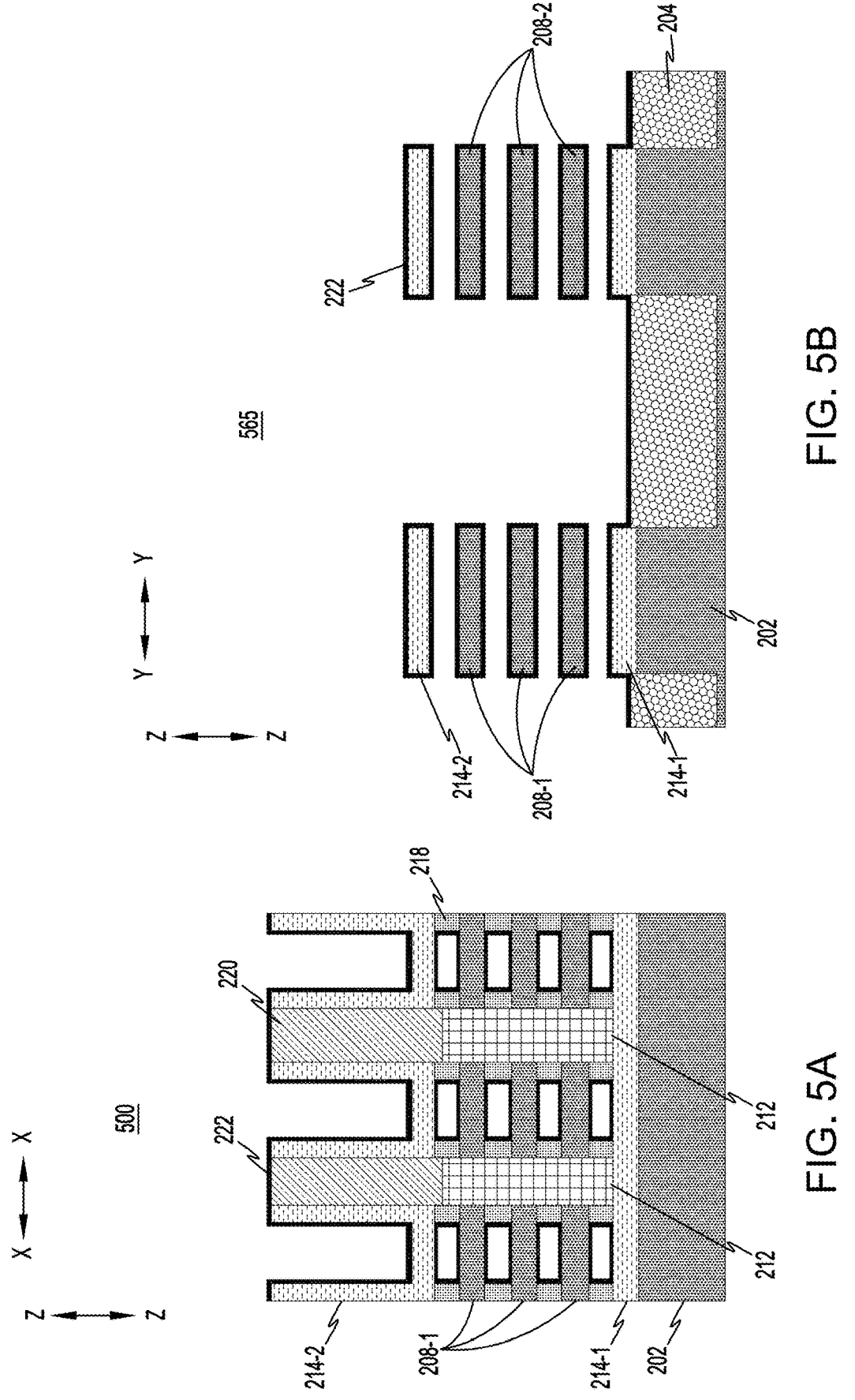
FIG. 5A shows a side cross-sectional view of the structure of FIG. 4A following formation of a gate dielectric layer, according to an embodiment of the invention.
FIG. 5B shows a side cross-sectional view of the structure of FIG. 4B following the formation of the gate dielectric layer, according to an embodiment of the invention.

FIGS. 5A and 5B show respective side cross-sectional views 500 and 565 of the structures of FIGS. 4A and 4B following formation of a gate dielectric layer 222. The gate dielectric layer 222 comprises a high-k dielectric material. Examples of high-k dielectric materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k dielectric material may further include dopants such as lanthanum (La), aluminum (Al), and magnesium (Mg). The gate dielectric layer 222 may have a uniform thickness in the range of 1 nm to 3 nm. As shown in FIGS. 5A and 5B, the gate dielectric layer 222 may be conformally deposited on all exposed surfaces, including over the STI regions 204, surrounding each of the nanosheet channels 208, the dielectric isolations layers 214, the inner spacers 218 and the ILD layer 220.

Figures 6A, 6B:
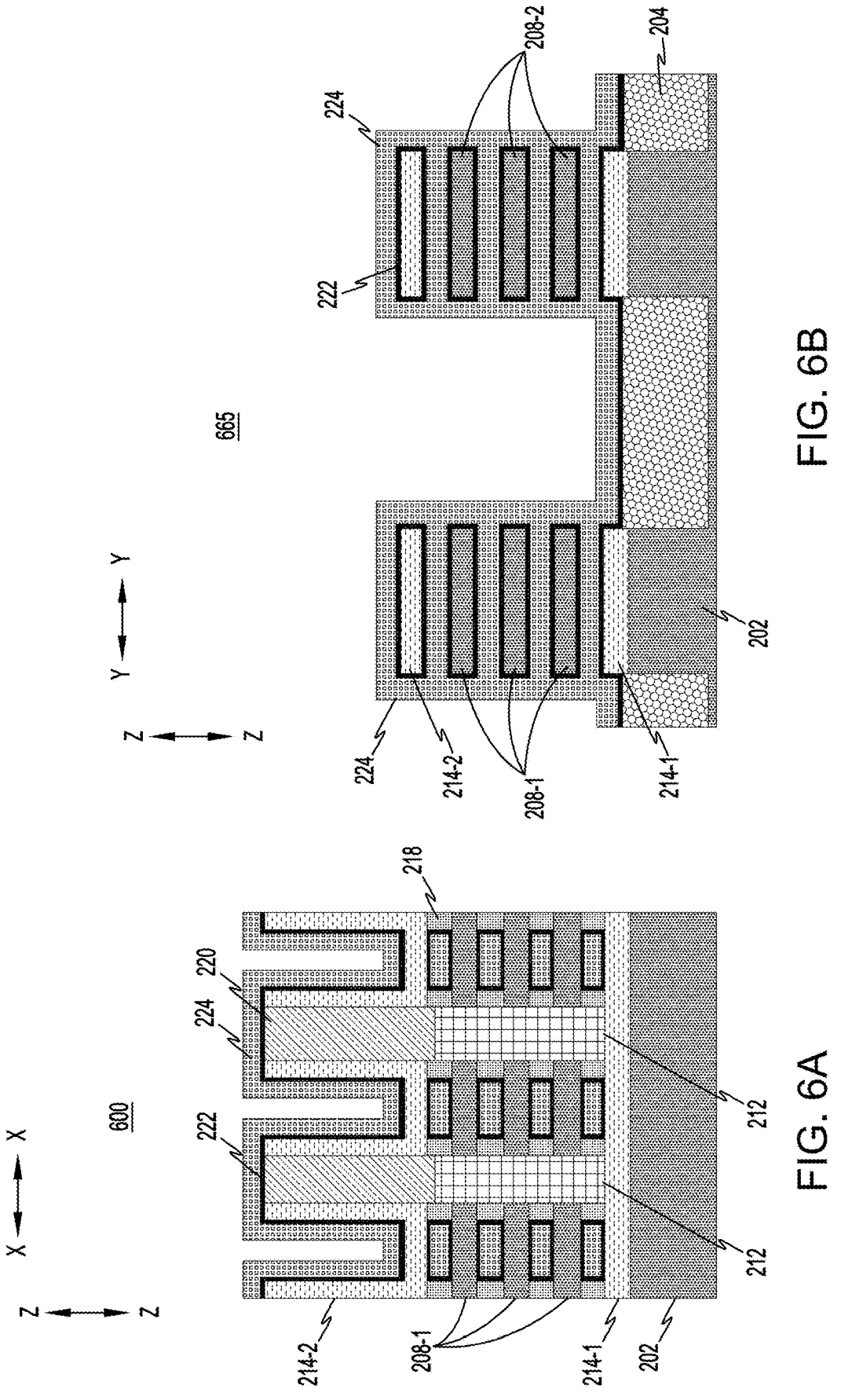
FIG. 6A shows a side cross-sectional view of the structure of FIG. 5A following formation of a first gate conductor layer, according to an embodiment of the invention.
FIG. 6B shows a side cross-sectional view of the structure of FIG. 5B following the formation of the first gate conductor layer, according to an embodiment of the invention.

FIGS. 6A and 6B show respective side cross-sectional views 600 and 665 of the structures of FIGS. 5A and 5B following formation of a first gate conductor layer 224. The first gate conductor layer 224 may comprise a metal gate or work function metal (WFM). For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for gate conductors as desired.

In the description below for clarity of illustration, it is assumed that the first gate conductor layer 224 comprises a pFET WFM in a process flow where the pFET WFM is formed before the nFET WFM. It should be appreciated, however, that in other embodiments the nFET WFM may be formed first followed by the pFET WFM. As shown in FIGS. 6A and 6B, the first gate conductor layer 224 fills in the spaces exposed by removal of the sacrificial layers 210, and surrounds the dielectric isolation layers 214 and is also formed over the top surface of the STI regions 204.

Figures 7A, 7B:
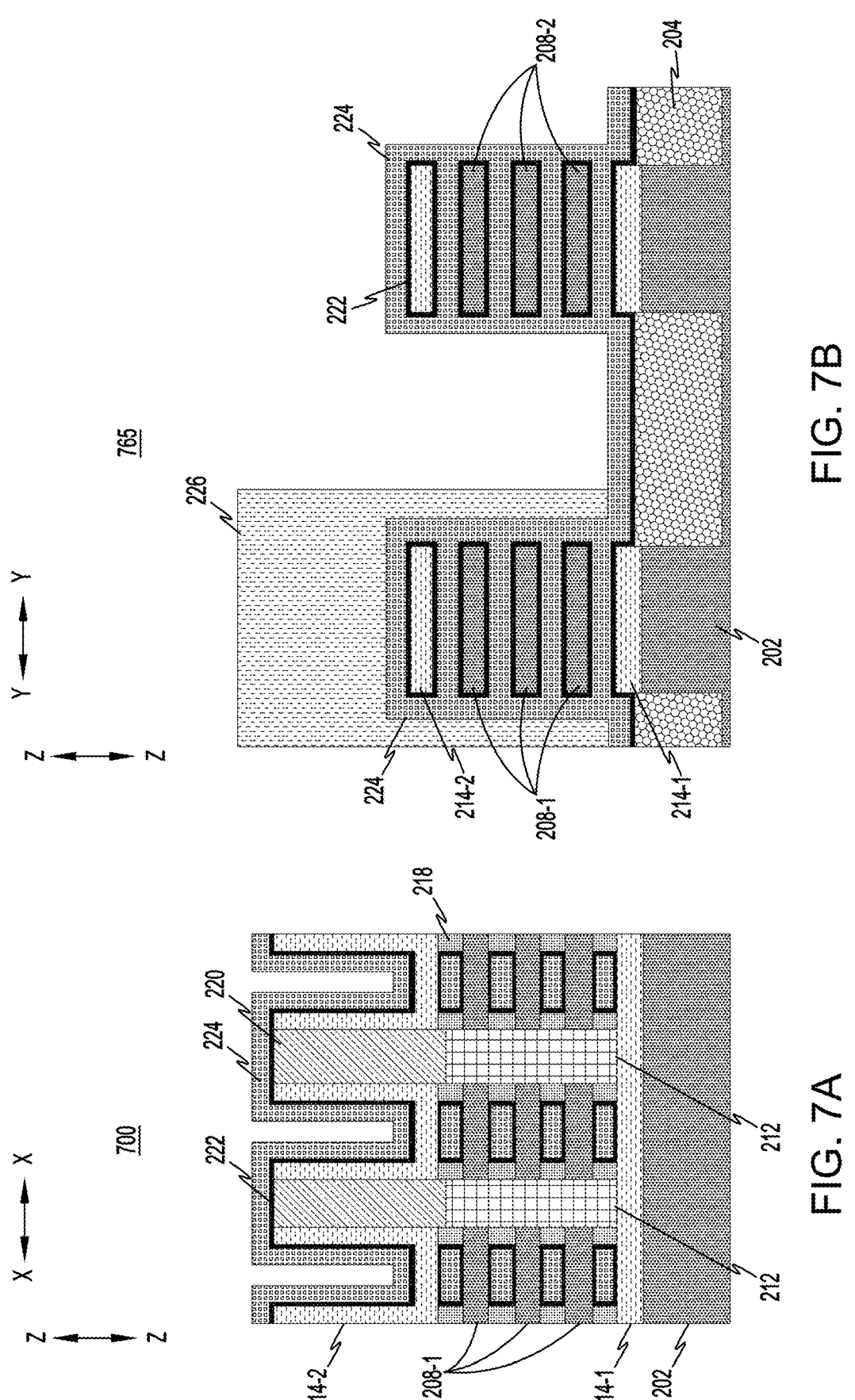
FIG. 7A shows a side cross-sectional view of the structure of FIG. 6A following patterning of an organic planarization layer over portions of the first gate conductor layer surrounding a first nanosheet stack, according to an embodiment of the invention.
FIG. 7B shows a side cross-sectional view of the structure of FIG. 6B following the patterning of the organic planarization layer over portions of the first gate conductor layer surrounding the first nanosheet stack, according to an embodiment of the invention.

FIGS. 7A and 7B show respective side cross-sectional views 700 and 765 of the structures of FIGS. 6A and 6B following patterning of an OPL 226 over the nanosheet stack 201-1 including the nanosheet channels 208-1 for the first type of device (e.g., pFET devices). The OPL 226 is not formed over the nanosheet stack 201-2 that includes the nanosheet channels 208-2 for the second type of device (e.g., nFET devices).

Figures 8A, 8B:
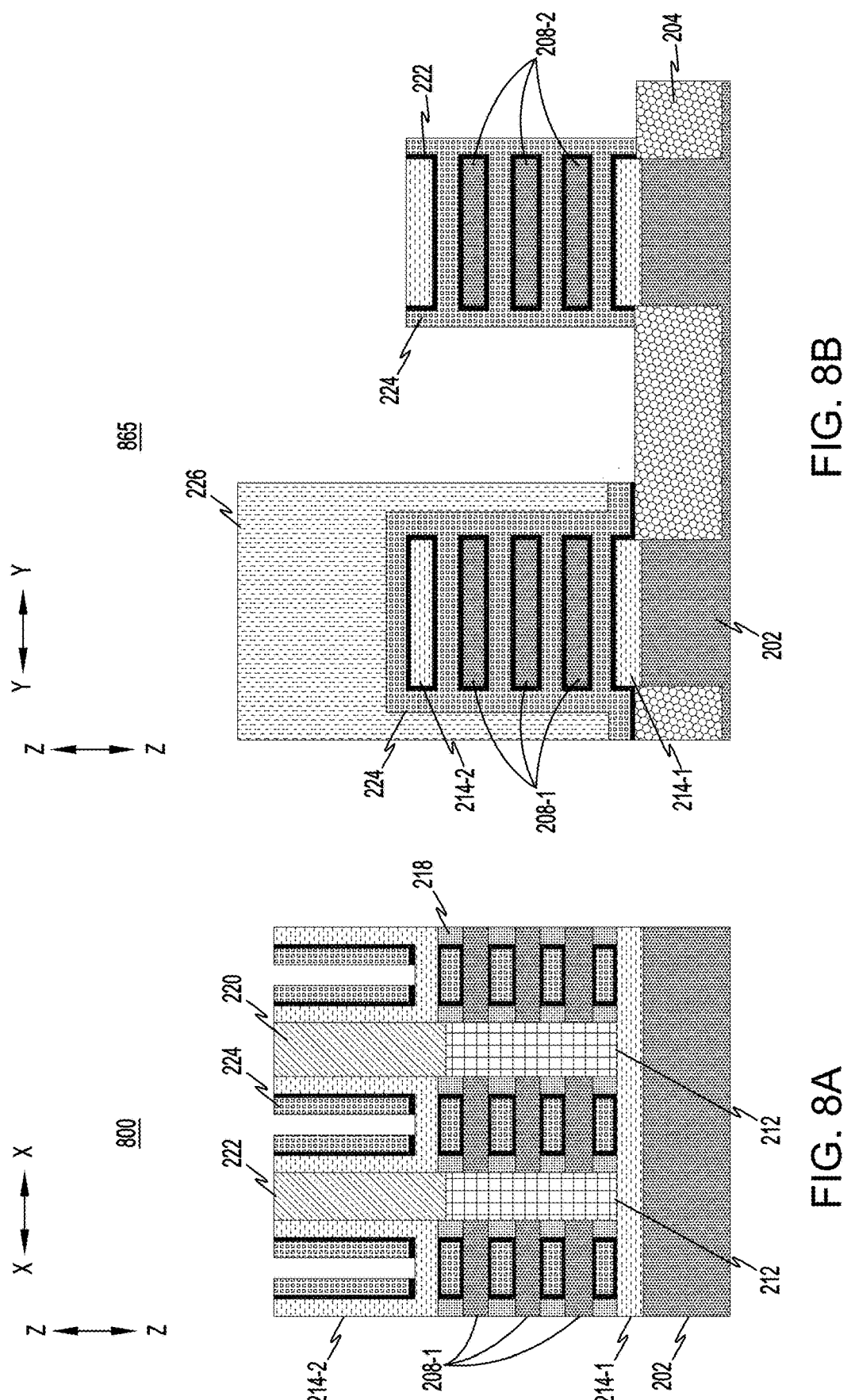
FIG. 8A shows a side cross-sectional view of the structure of FIG. 7A following a directional etch of exposed portions of the first gate conductor layer and the gate dielectric layer, according to an embodiment of the invention.
FIG. 8B shows a side cross-sectional view of the structure of FIG. 7B following the directional etch of the exposed portions of the first gate conductor layer and the gate dielectric layer, according to an embodiment of the invention.

FIGS. 8A and 8B show respective side cross-sectional views 800 and 865 of the structures of FIGS. 7A and 7B following a directional etch which removes exposed portions of the first gate conductor layer 224 and the gate dielectric layer 222. The directional etch may utilize RIE or other suitable processing which removes the material of the first gate conductor layer 224 and the gate dielectric layer 222. Advantageously, the dielectric isolation layer 214-2 protects the topmost one of the nanosheet channels 208-2 in the nanosheet stack 201-1. Portions of the gate dielectric layer 222 formed on the top surface of the dielectric isolation layer 214-2 in the nanosheet stack 201-2 are removed as illustrated (e.g., such that the gate dielectric layer 222 remains only on the top of the dielectric isolation layers 214-2 for the nanosheet stack 201-1).

Figures 9A, 9B:
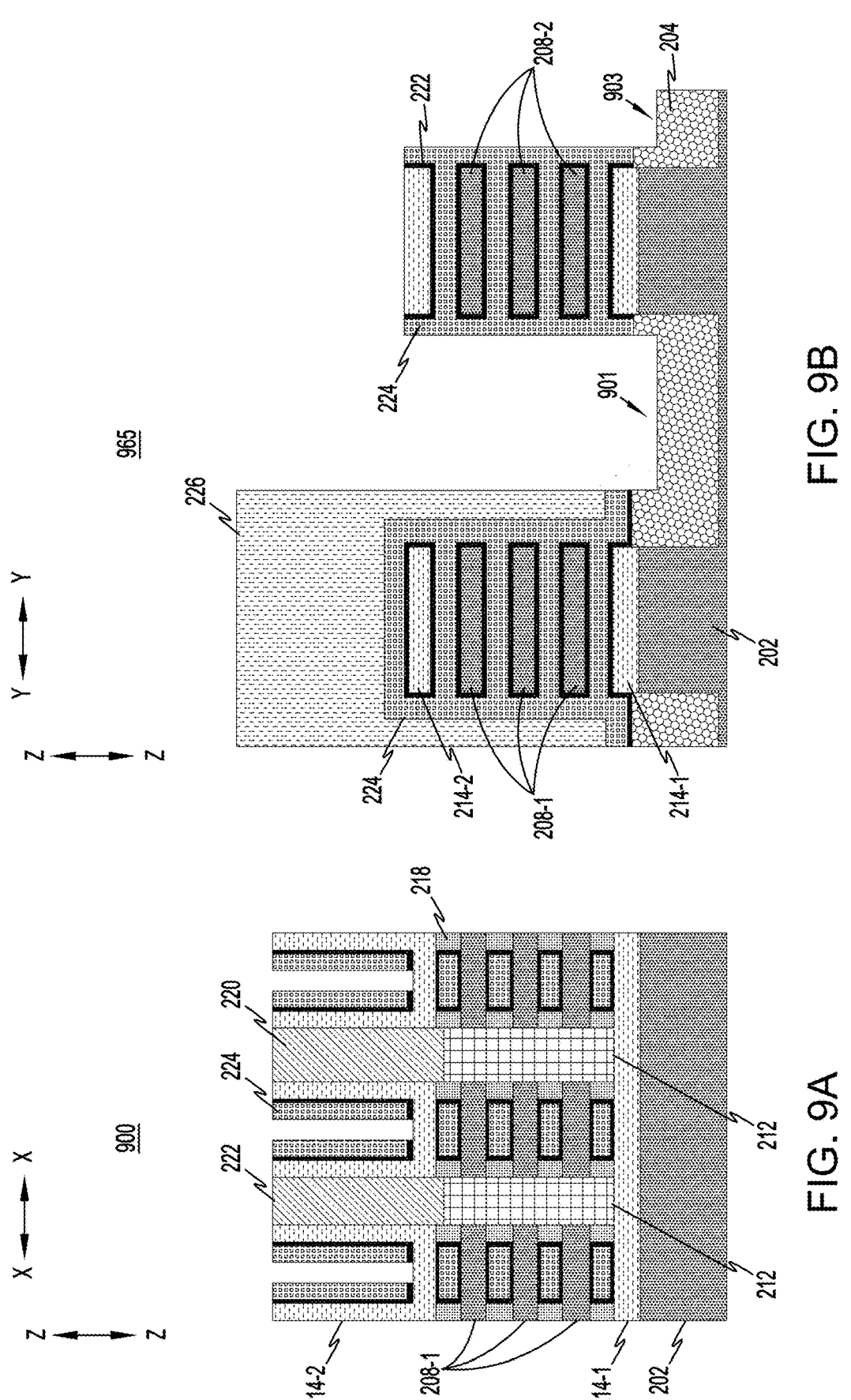
FIG. 9A shows a side cross-sectional view of the structure of FIG. 8A following etch-back of exposed portions of the shallow trench isolation regions, according to an embodiment of the invention.
FIG. 9B shows a side cross-sectional view of the structure of FIG. 8B following the etch-back of the exposed portions of the shallow trench isolation regions, according to an embodiment of the invention.

FIGS. 9A and 9B show respective side cross-sectional views 900 and 965 of the structures of FIGS. 8A and 8B following etch-back of exposed portions of the STI regions 204. The etch-back results in recessed regions 901 and 903 on either side of the nanosheet stack 201-2. The depth of the recessed regions 901 and 903 (in direction Z) may be in the range of 5-10 nm.

Figures 10A, 10B:
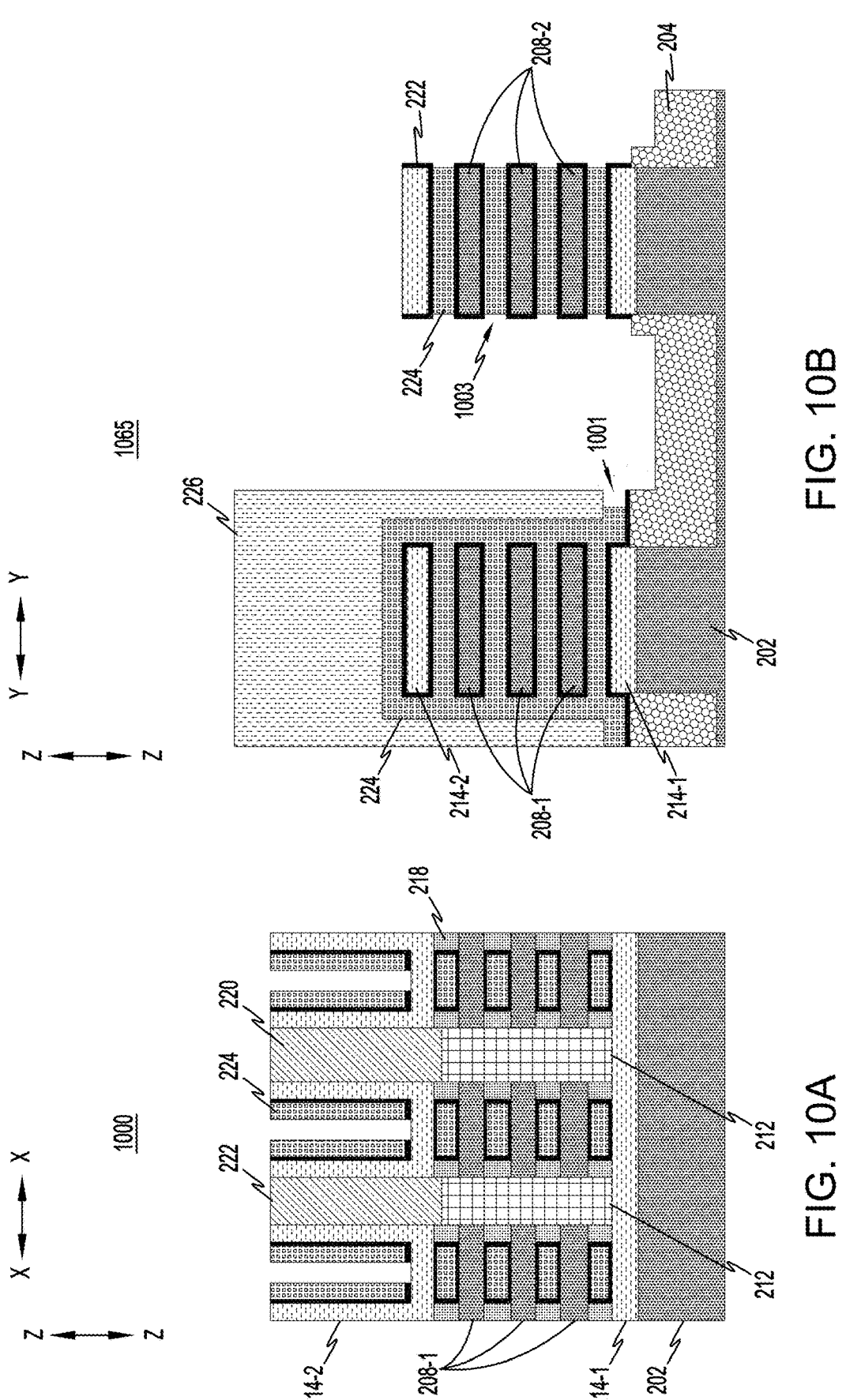
FIG. 10A shows a side cross-sectional view of the structure of FIG. 9A following isotropic removal of exposed portions of the first gate conductor layer, according to an embodiment of the invention.
FIG. 10B shows a side cross-sectional view of the structure of FIG. 9B following the isotropic removal of the exposed portions of the first gate conductor layer, according to an embodiment of the invention.

FIGS. 10A and 10B show respective side cross-sectional views 1000 and 1065 of the structures of FIGS. 9A and 9B following isotropic removal of exposed portions of the first gate conductor layer 224. The isotropic removal results in an indent region 1001 on one side of the nanosheet stack 201-1, as well as indent regions 1003 on both sides of the nanosheet stack 201-2. The indent region 1001 defines a stepped structure between the STI region 204 and the first gate conductor layer 224 on one side of the nanosheet stack 201-1 and on both sides of the nanosheet stack 201-2 as illustrated.

Figures 11A, 11B:
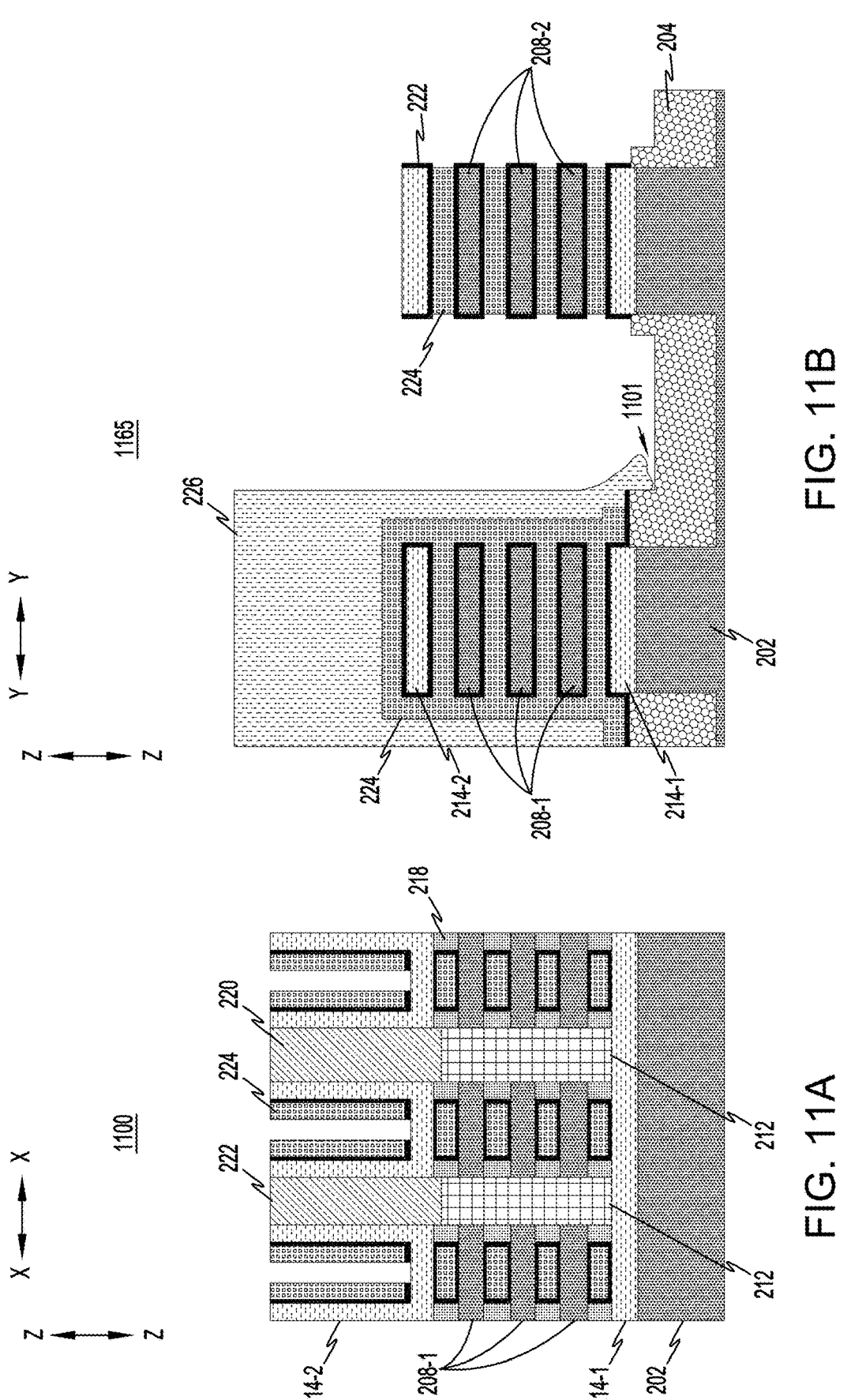
FIG. 11A shows a side cross-sectional view of the structure of FIG. 10A following reflow of the organic planarization layer, according to an embodiment of the invention.
FIG. 11B shows a side cross-sectional view of the structure of FIG. 10B following the reflow of the organic planarization layer, according to an embodiment of the invention.

FIGS. 11A and 11B show respective side cross-sectional views 1100 and 1165 of the structures of FIGS. 10A and 10B following reflow of the OPL 226. The reflow of the OPL 226 fills in the indent region 1001, although there may be a pin-hole region 1101 as shown between the reflowed OPL 226 and the STI region 204.

Figures 12A, 12B:
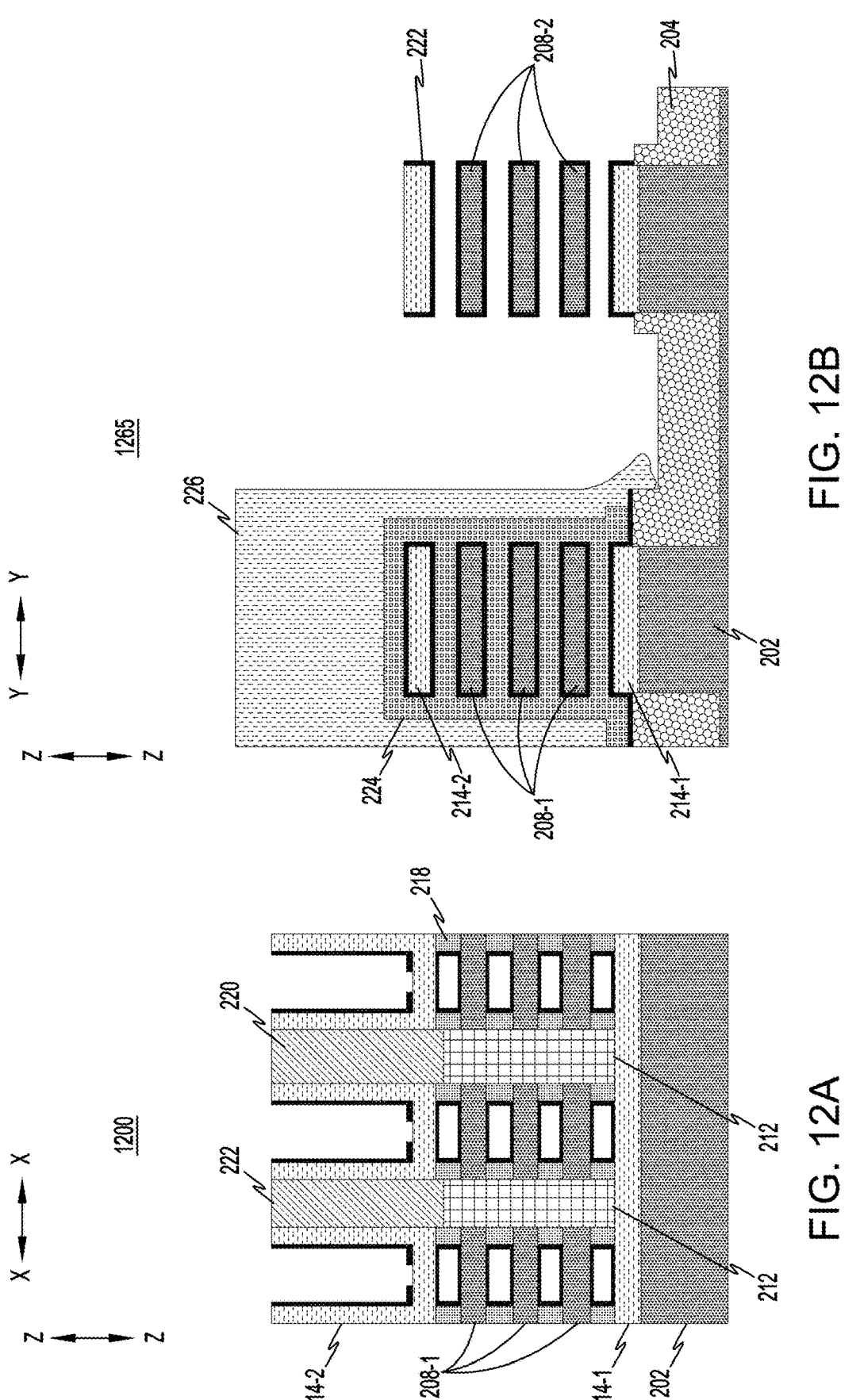
FIG. 12A shows a side cross-sectional view of the structure of FIG. 11A following additional isotropic etching of exposed portions of the first gate conductor layer, according to an embodiment of the invention.
FIG. 12B shows a side cross-sectional view of the structure of FIG. 11B following the additional isotropic etching of the exposed portions of the first gate conductor layer, according to an embodiment of the invention.

FIGS. 12A and 12B show respective side cross-sectional views 1200 and 1265 of the structures of FIGS. 11A and 11B following additional isotropic etching of exposed portions of the first gate conductor layer 224. This continues until the first gate conductor layer 224 is completely removed in the region surrounding nanosheet stack 201-2. Advantageously, the combination of the reflowed OPL 226 and the stepped structure of the STI region 204 prevents over-etching under the OPL 226 (e.g., such that the first gate conductor layer 224 remains surrounding the nanosheet stack 201-1).

Figures 13A, 13B:
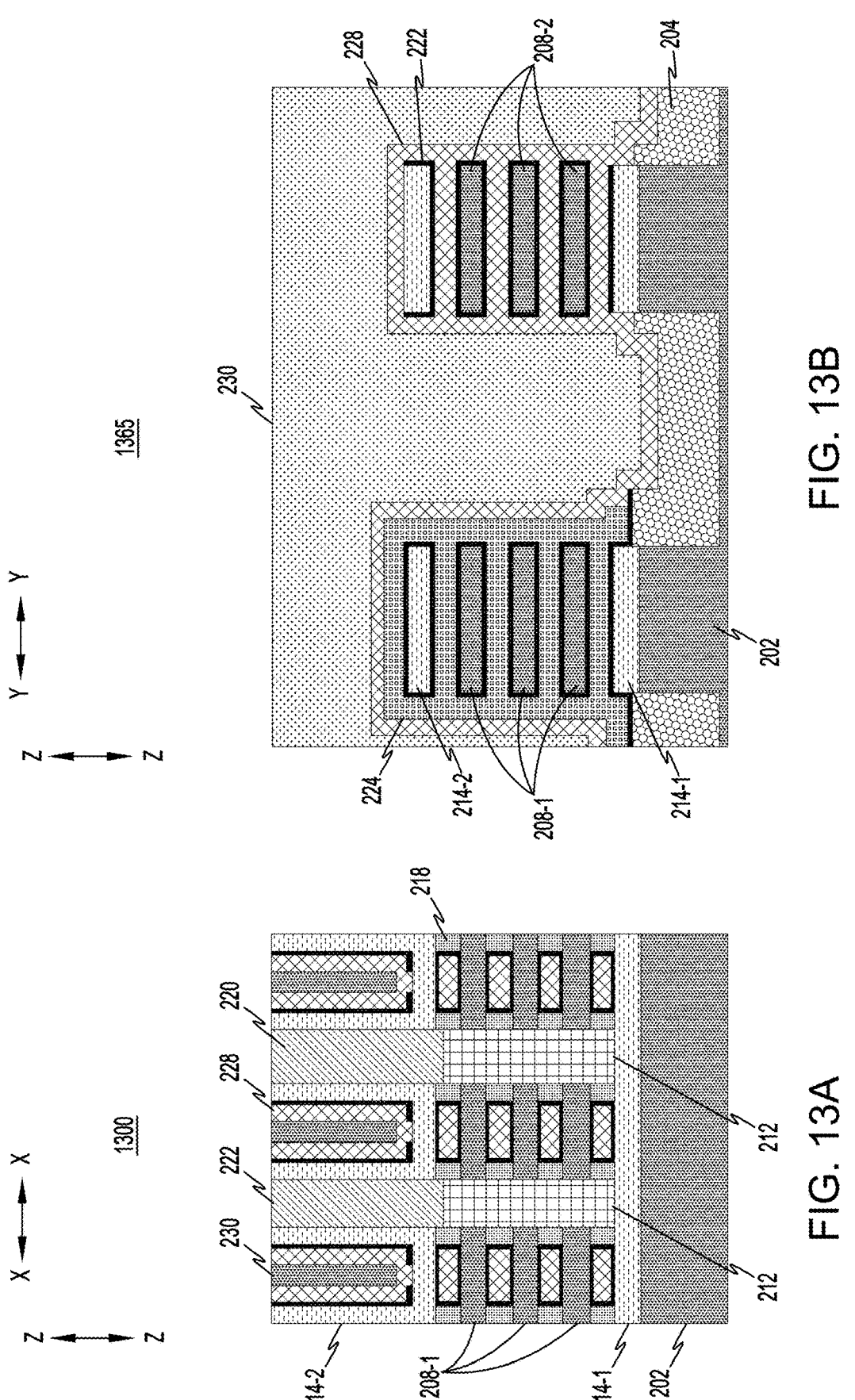
FIG. 13A shows a side cross-sectional view of the structure of FIG. 12A following formation of a second gate conductor layer and contact material, according to an embodiment of the invention.
FIG. 13B shows a side cross-sectional view of the structure of FIG. 12B following the formation of the second gate conductor layer and the contact material, according to an embodiment of the invention.

FIGS. 13A and 13B show respective side cross-sectional views 1300 and 1365 of the structures of FIGS. 12A and 12B following removal of the OPL 226, and following formation of a second gate conductor layer 228 and contact material 230. The second gate conductor layer 228 is illustratively a different material than the first gate conductor layer 224. For example, where the first gate conductor layer 224 is a pFET WFM, the second gate conductor layer 228 is a nFET WFM. The contact material 230 is deposited and then planarized (e.g., using CMP or other suitable processing). The contact material 230 may include a silicide layer such as titanium (Ti), nickel (Ni), nickel platinum (NiPt), etc., a metal adhesion layer (e.g., such as TiN) and a low resistance metal such as tungsten (W), ruthenium (Ru), cobalt (Co) or another suitable material.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 14:
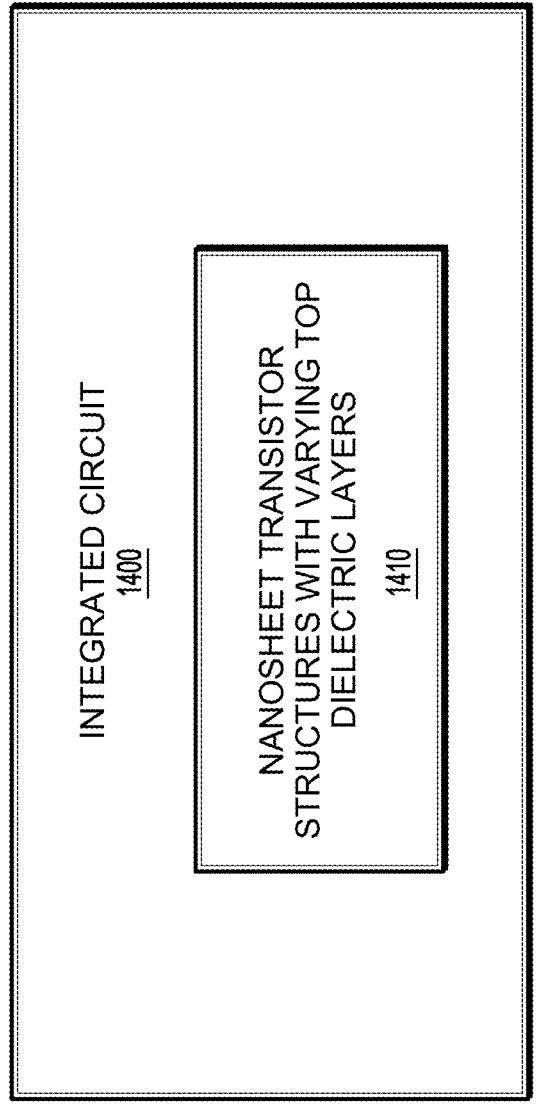
FIG. 14 depicts an integrated circuit comprising one or more nanosheet transistor structures with varying top dielectric layers, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 14 shows an example integrated circuit 1400 which includes one or more nanosheet transistor structures 1410 with varying top dielectric layers.

In some embodiments, a semiconductor structure comprises a first nanosheet stack comprising one or more first nanosheet channel layers and a first dielectric isolation layer over the one or more first nanosheet channel layers, a second nanosheet stack comprising one or more second nanosheet channel layers and a second dielectric isolation layer over the one or more second nanosheet channel layers, and a gate dielectric layer disposed over a top surface of one of the first dielectric isolation layer and the second dielectric isolation layer.

The gate dielectric layer may be further disposed on a bottom surface and sidewalls of both the first dielectric isolation layer and the second dielectric isolation layer.

The first dielectric isolation layer may have a first width that is equal to or greater than widths of the underlying one or more first nanosheet channel layers of the first nanosheet stack, and the second dielectric isolation layer may have a second width that is equal to or greater than widths of the underlying one or more second nanosheet channel layers of the second nanosheet stack.

The semiconductor structure may further comprise a first gate conductor layer surrounding the one or more first nanosheet channel layers of the first nanosheet stack, and a second gate conductor layer surrounding the one or more second nanosheet channel layers of the second nanosheet stack. The second gate conductor layer may further surround the first gate conductor layer. The first gate conductor layer may comprise a first WFM material and the second gate conductor layer may comprise a second WFM material.

The semiconductor structure may further comprise a STI region disposed over a substrate between the first nanosheet stack and the second nanosheet stack. The gate dielectric layer may be (i) disposed over a first portion of the STI region between the first nanosheet stack and the second nanosheet stack and (ii) not disposed over a second portion of the STI region between the first nanosheet stack and the second nanosheet stack. The second portion of the STI region may be recessed below a top surface of the first portion of the STI region. The first portion of the STI region may be adjacent the first nanosheet stack and the second portion of the STI region may be adjacent the second nanosheet stack.

In some embodiments, a semiconductor structure comprises a first nanosheet stack, a second nanosheet stack, a STI region disposed over a substrate between the first nanosheet stack and the second nanosheet stack, and a gate dielectric layer (i) disposed over a first portion of the STI region between the first nanosheet stack and the second nanosheet stack and (ii) not disposed over a second portion of the STI region between the first nanosheet stack and the second nanosheet stack.

The second portion of the STI region may be recessed below a top surface of the first portion of the STI region.

The first portion of the STI region may be adjacent the first nanosheet stack and the second portion of the STI region may be adjacent the second nanosheet stack.

The first nanosheet stack may comprise one or more first nanosheet channel layers and a first dielectric isolation layer over the one or more first nanosheet channel layers, and the second nanosheet stack may comprise one or more second nanosheet channel layers and a second dielectric isolation layer over the one or more second nanosheet channel layers. The gate dielectric layer may be further disposed on a bottom surface and sidewalls of both the first dielectric isolation layer and the second dielectric isolation layer, and a top surface of the first dielectric isolation layer.

In some embodiments, an integrated circuit comprises a nanosheet transistor structure comprising a first nanosheet stack comprising one or more first nanosheet channel layers and a first dielectric isolation layer over the one or more first nanosheet channel layers, a second nanosheet stack comprising one or more second nanosheet channel layers and a second dielectric isolation layer over the one or more second nanosheet channel layers, and a gate dielectric layer disposed over a top surface of one of the first dielectric isolation layer and the second dielectric isolation layer.

The gate dielectric layer may be further disposed on a bottom surface and sidewalls of both the first dielectric isolation layer and the second dielectric isolation layer.

The nanosheet transistor structure may further comprise a STI region disposed over a substrate between the first nanosheet stack and the second nanosheet stack. The gate dielectric layer may be (i) disposed over a first portion of the STI region between the first nanosheet stack and the second nanosheet stack and (ii) not disposed over a second portion of the STI region between the first nanosheet stack and the second nanosheet stack. The second portion of the STI region is recessed below a top surface of the first portion of the STI region.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a first nanosheet stack comprising one or more first nanosheet channel layers and a first dielectric isolation layer over the one or more first nanosheet channel layers;
a second nanosheet stack comprising one or more second nanosheet channel layers and a second dielectric isolation layer over the one or more second nanosheet channel layers; and
a gate dielectric layer (i) disposed over a top surface of the first dielectric isolation layer and (ii) not disposed over at least a portion of a top surface of the second dielectric isolation layer.

2. The semiconductor structure of claim 1, wherein the gate dielectric layer is further disposed on a bottom surface and sidewalls of both the first dielectric isolation layer and the second dielectric isolation layer.

3. The semiconductor structure of claim 1, wherein the first dielectric isolation layer has a first width that is equal to or greater than widths of the underlying one or more first nanosheet channel layers of the first nanosheet stack, and wherein the second dielectric isolation layer has a second width that is equal to or greater than widths of the underlying one or more second nanosheet channel layers of the second nanosheet stack.

4. The semiconductor structure of claim 1, further comprising:
a first gate conductor layer surrounding the one or more first nanosheet channel layers of the first nanosheet stack; and
a second gate conductor layer surrounding the one or more second nanosheet channel layers of the second nanosheet stack.

5. The semiconductor structure of claim 4, wherein the second gate conductor layer further surrounds the first gate conductor layer.

6. The semiconductor structure of claim 4, wherein the first gate conductor layer comprises a first work function metal material and the second gate conductor layer comprises a second work function metal material.

7. The semiconductor structure of claim 1, further comprising a shallow trench isolation region disposed over a substrate between the first nanosheet stack and the second nanosheet stack.

8. The semiconductor structure of claim 7, wherein the gate dielectric layer is further (iii) disposed over a first portion of the shallow trench isolation region between the first nanosheet stack and the second nanosheet stack and (iv) not disposed over a second portion of the shallow trench isolation region between the first nanosheet stack and the second nanosheet stack.

9. The semiconductor structure of claim 8, wherein the second portion of the shallow trench isolation region is recessed below a top surface of the first portion of the shallow trench isolation region.

10. The semiconductor structure of claim 8, wherein the first portion of the shallow trench isolation region is adjacent the first nanosheet stack and the second portion of the shallow trench isolation region is adjacent the second nanosheet stack.

11. A semiconductor structure comprising:
a first nanosheet stack;
a second nanosheet stack;
a shallow trench isolation region disposed over a substrate between the first nanosheet stack and the second nanosheet stack; and
a gate dielectric layer (i) disposed over a first portion of the shallow trench isolation region between the first nanosheet stack and the second nanosheet stack and (ii) not disposed over a second portion of the shallow trench isolation region between the first nanosheet stack and the second nanosheet stack.

12. The semiconductor structure of claim 11, wherein the second portion of the shallow trench isolation region is recessed below a top surface of the first portion of the shallow trench isolation region.

13. The semiconductor structure of claim 11, wherein the first portion of the shallow trench isolation region is adjacent the first nanosheet stack and the second portion of the shallow trench isolation region is adjacent the second nanosheet stack.

14. The semiconductor structure of claim 11, wherein the first nanosheet stack comprises one or more first nanosheet channel layers and a first dielectric isolation layer over the one or more first nanosheet channel layers, and wherein the second nanosheet stack comprises one or more second nanosheet channel layers and a second dielectric isolation layer over the one or more second nanosheet channel layers.

15. The semiconductor structure of claim 14, wherein the gate dielectric layer is further disposed on:

a bottom surface and sidewalls of both the first dielectric isolation layer and the second dielectric isolation layer; and a top surface of the first dielectric isolation layer.

16. An integrated circuit comprising:

a nanosheet transistor structure comprising:

a first nanosheet stack comprising one or more first nanosheet channel layers and a first dielectric isolation layer over the one or more first nanosheet channel layers;

a second nanosheet stack comprising one or more second nanosheet channel layers and a second dielectric isolation layer over the one or more second nanosheet channel layers; and a gate dielectric layer (i) disposed over a top surface of the first dielectric isolation layer and (ii) not disposed over at least a portion of a top surface of the second dielectric isolation layer.

17. The integrated circuit of claim 16, wherein the gate dielectric layer is further disposed on a bottom surface and sidewalls of both the first dielectric isolation layer and the second dielectric isolation layer.

18. The integrated circuit of claim 16, wherein the nanosheet transistor structure further comprises a shallow trench isolation region disposed over a substrate between the first nanosheet stack and the second nanosheet stack.

19. The integrated circuit of claim 18, wherein the gate dielectric layer is further (iii) disposed over a first portion of the shallow trench isolation region between the first nanosheet stack and the second nanosheet stack and (iv) not disposed over a second portion of the shallow trench isolation region between the first nanosheet stack and the second nanosheet stack.

20. The integrated circuit of claim 19, wherein the second portion of the shallow trench isolation region is recessed below a top surface of the first portion of the shallow trench isolation region.

\* \* \* \* \*